(12) United States Patent
Lucas et al.

(10) Patent No.: US 6,818,362 B1
(45) Date of Patent: Nov. 16, 2004

(54) PHOTOLITHOGRAPHY RETICLE DESIGN

(75) Inventors: Kevin D. Lucas, Meylan (FR); Robert E. Boone, Grenoble (FR); Lloyd C. Litt, Austin, TX (US); Wei E. Wu, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 10/782,566

(22) Filed: Feb. 19, 2004

(51) Int. Cl.[7] .............................. G03F 9/00; G06F 17/50
(52) U.S. Cl. ................................ 430/5; 430/30; 716/19
(58) Field of Search .......................... 430/5, 30; 716/19

(56) References Cited

U.S. PATENT DOCUMENTS

| | | | |
|---|---|---|---|
| 5,849,440 A | * 12/1998 | Lucas et al. | 430/5 |
| 6,312,854 B1 | 11/2001 | Chen et al. | |
| 6,335,130 B1 | 1/2002 | Chen et al. | |
| 6,482,555 B2 | 11/2002 | Chen et al. | |
| 6,541,167 B2 | 4/2003 | Petersen et al. | |
| 6,709,793 B1 | * 3/2004 | Brankner et al. | 430/5 |
| 2002/0048708 A1 | 4/2002 | Chen et al. | |

OTHER PUBLICATIONS

Kasprowicz et al., "Application of Chromeless Phase Lithography (CPL) Masks in ArF Lithography," 22nd Annual BACUS Symposium on Photomask Technology, vol. 4889, pp. 1189–1201, Oct. 2002 by Photronics, Motorola, Inc., and ASML Mask Tools.

U.S. patent application No. 10/261,905 filed Oct. 1, 2002 entitled "A Photomask Having Line End Phase Anchors", assignee same as assignee hereof.

\* cited by examiner

Primary Examiner—Saleha R. Mohamedulla
(74) Attorney, Agent, or Firm—David G. Dolezal; Michael J. Balconi-Lamica

(57) ABSTRACT

A method of generating a design of a reticle for a photolithography process. The reticle may include phase shift features, binary features, and mixed features. The method includes generating a reticle design from a pattern layout and then optimizing the reticle design. In some examples, generating the reticle design includes binning the features of the layout based on feature width. Examples of optimization operations include an over/under operation, an under/over operation, a feature segment expansion operation, a feature edge portion conversation from a binary portion to a phase shift portion, a corner binary segment expansion, a discontinuity removal operation, and a feature dimension change operation that includes a determination of a Mask Error Factor (MEF).

22 Claims, 5 Drawing Sheets

PHOTOLITHOGRAPHY RETICLE DESIGN

BACKGROUND OF THE INVENTION

1. Field of the Invention

This invention relates in general to the design of a reticle for a photolithography process.

2. Description of the Related Art

Traditional lithography for semiconductor manufacture utilize chrome and/or low transmission attenuated phase shift mask (AttPSM) features on reticles (masks) to block light from transmitting to portions of a photosensitive layer on a semiconductor wafer. The chrome and/or AttPSM patterns on the reticle are generated to resemble the polygon patterns of a design layout of a circuit.

Basic lithography problems may become more severe as the need increases for smaller pitch and finer individual features for each device generation. This need for smaller dimensions causes problems related to the loss of linearity in an imaging system. Some of these problems include high mask error factor values, low dose latitude, low depth of focus, large line-end pullback with standard binary materials (e.g. chrome) or low attenuation materials (e.g. AttPSMs).

The use of higher transmission attenuated phase shift masks and "chromeless" phase masks (CPL) in combination with off-axis illumination is known to help reduce these problems. High transmission AttPSM reticles have features defined by a 180 degree phase transition and a partial light transmission intensity e.g. above about 16%. Chromeless reticles have features defined by a 180 degree phase transition and 100% light transmission intensity. However, with AttPSM and chromeless reticles, there are problems with the patterning of large features where undesired extra patterns may form on the wafer or no pattern at all may form on the wafer. For chromeless reticles, increasing the size of the reticle feature may cause the corresponding feature size on the wafer to decrease. This is known as negative Mask Error Factor (MEF).

A variant of a chromeless reticle has been proposed in which desired smaller features on the wafer are formed using phase shifting features on the reticle, and larger features on the wafer are formed using standard chrome features on the reticle. Another known variant is the use of so-called zebra features on the reticle to produce intermediate feature sizes on the wafer. Zebra features are mixed features with alternating segments of binary and phase shift features. Each segment in the zebra feature is near or below the resolution limit of the optical system. Therefore, the imaged zebra features behave in a manner in between a phase shift feature and a binary feature, producing better imaging than binary but without such drastic negative MEF problems of phase shift features.

However, it is clear that to obtain the benefits of high transmission AttPSM or chromeless reticles in production of devices, new techniques are needed in order to transform traditional physical layout designs (which assume all reticle features are binary) into reticle designs compatible with the use of chromeless and zebra reticle features.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates identical items unless otherwise noted.

DETAILED DESCRIPTION

The following sets forth a detailed description of a mode for carrying out the invention. The description is intended to be illustrative of the invention and should not be taken to be limiting.

Figure 1:
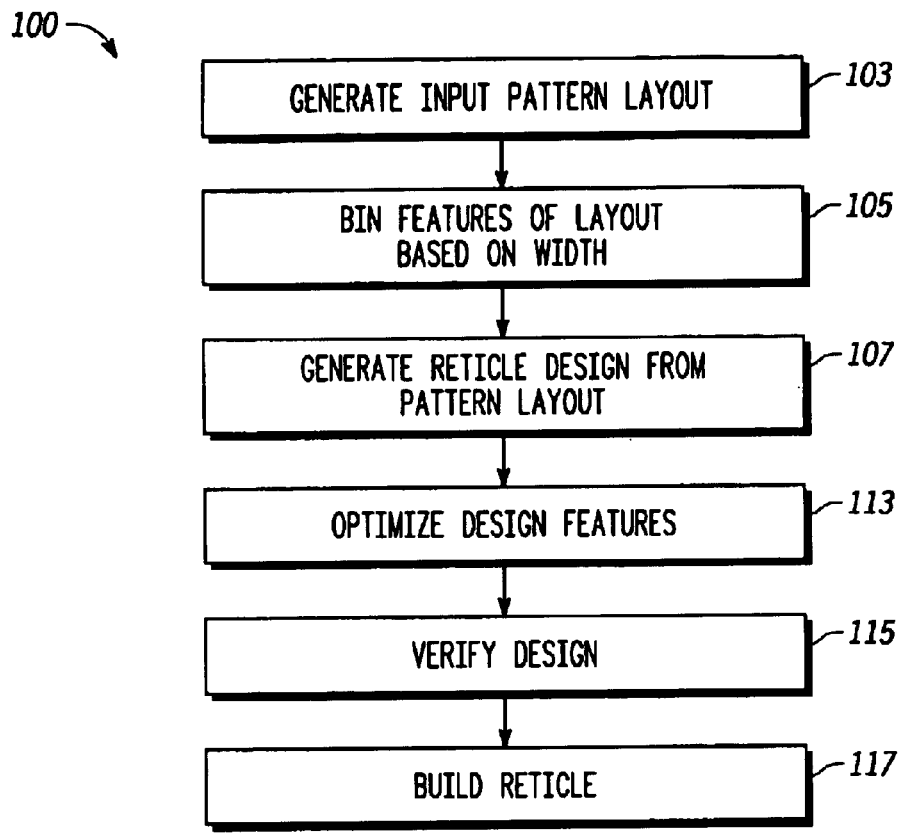
FIG. 1 is a flow diagram of one embodiment of building a reticle from a pattern layout according to the present invention.

FIG. 1 is a flow diagram of one embodiment of building a reticle to pattern a layer on a wafer according to the present invention. In the embodiment shown, the reticles designed and built with the flow of FIG. 1 include both phase shift features (e.g. AttPSM and chromeless), binary features, and mixed features. In one embodiment, the binary features are implemented with a binary material (e.g. chrome) coated or deposited on a transparent substrate such as e.g. fused silica or quartz. The phase features may be implemented with phase shift material (e.g. attenuating material or non attenuating material) coated on the transparent substrate or by raising or lowering portions of the transparent substrate to provide for a phase shift of light passing through the substrate from light passing through other portions of the substrate. The mixed features may be implemented with both binary and phase shift segments.

In 103, an input pattern layout is generated. An input pattern layout includes a design for features of a wafer to be formed on the wafer with the use of a reticle in a photoligraphic process. In one embodiment, this layout is generated with the use of computer aided design tools. In an additional embodiment, certain features in the layout are identified and sized up or sized down using computer aided design tools during layout generation in order to improve manufacturing of these features on the wafer or to reduce reticle design processing complexity. In one embodiment, the designed reticle may be used to pattern a layer of polysilcon on a wafer for forming polysilicon lines on the wafer. With such an embodiment, the layout would include a design for features for forming the polysilicon lines and may include features for forming other sacrificial features or portions that are removed in later layer processing steps.

In 105, the features of the layout are "binned" or grouped based on the width of the feature. In one embodiment, the features are placed in three "bins." The first bin includes features having a width in which they are to be implemented as phase shift features of a reticle. A second bin includes features having a width that they are to be implemented as binary features of a reticle. The third bin includes widths that are of a dimension between the feature widths of the first bin and of the second bin. These feature widths are of a dimension to be implemented as zebra features that include phase shift feature segments (phase shift segments) and binary feature segments (binary segments). For one embodiment, any feature having a width less than 120 nm is placed in the phase shift bin, any feature having a width greater than 200 nm is placed in the binary bin, and features having widths in between 120 and 200 nm are placed in the zebra bin. In other embodiments, bins may be defined by different dimensions based on other factors such as wavelength of the stepper light, numerical aperture, illumination type, and characteristics of the photo-resist processes. In some embodiments, some features may include segments that have a width to be placed in one bin and a second width to be placed in another bin. For these features, the portions of the feature may be "binned" in separate bins wherein the feature would appear on the reticle as a mixed feature (e.g. a feature including both a binary portion and a phase shift portion). Zebra features are examples of mixed features.

In 107, the pattern layout is mapped to a reticle design. In 107, the features binned in the binary bin are implemented as binary design features in the reticle design. The features binned in the phase shift bin are implemented as phase shift design features in the reticle design. Features have both binary segments and phase shift segments are implemented as mixed designed features.

Also in 107, design features are generated for implementing the features in the zebra bin. The design features in the zebra bin include features with both binary segments and phase shift segments. In one embodiment, the segments of the zebra design features are determined by a tiling e.g. see FIG. 8. However, in other embodiments, these features may be determined by other techniques. In some embodiments, some of the features of the pattern layout may be resized prior to operation 105 to reduce the number of features binned into the zebra bin.

In 113, the reticle design features of the reticle design are optimized. The design features may be optimized in a number of ways. For example, a design may be optimized by merging or reclassifying portions of a segment feature that are too small for forming on the reticle. In other examples, a design feature may be optimized by extending binary segments to allow for robust overlay during reticle manufacturing or preferentially placing phase shift segments at an edge of a feature. A design feature may also be optimized by using known model-based or rule-based optical proximity correction techniques. Other optimizations may include optimizing a feature having non 90 degree angles and ensuring a straight line on a wafer feature formed by photo-resist features defined by mixed features of a reticle. These optimizations may provide for improved image fidelity and process latitude on a wafer.

In 115, the reticle design for the reticle is verified (e.g. checked for design rule violations). In 117, a reticle is built from the reticle design. In some embodiments, building a reticle from the reticle design may include a number of patternings (e.g. one patterning for the binary segments and another for the phase segments). Afterwards, a layer of photo-resist may be patterned by exposing the photo-resist to radiation through the reticle.

In some embodiments of FIG. 1, optimization of a zebra feature may be performed as part of the generation or the zebra feature. In other embodiments, the optimization of a zebra feature may be performed when the zebra feature is binned (e.g. in 105).

In one embodiment, the operations of FIG. 1 are performed with the use of a computer aided design tool with the design features binned and optimized being computerized representations of those features.

Figure 2:
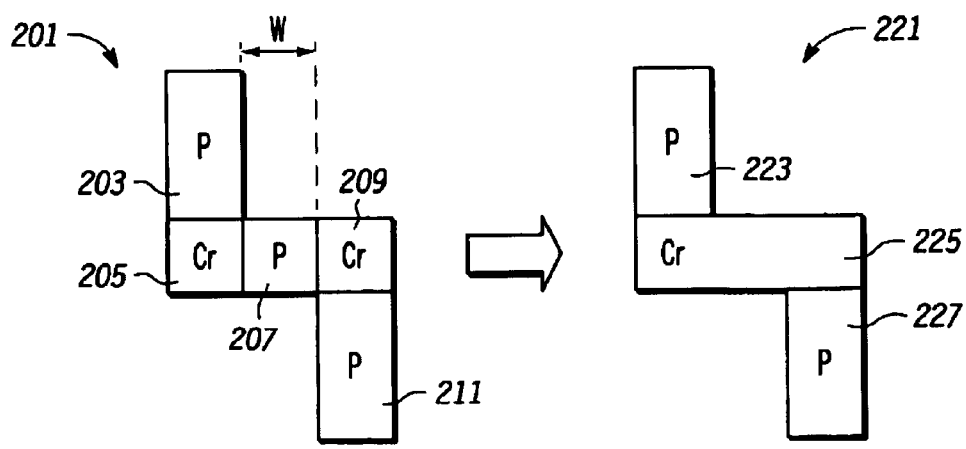
FIG. 2 is top view of one embodiment of a design feature and an optimized design feature according to the present invention.

FIG. 2 shows a design feature 201 for a reticle and a second design feature 221 for a reticle which is an optimized feature of feature 201. Design feature 201 is a mixed feature having chrome segments (37 Cr") 205 and 209 and phase shift (P) segments 203, 207, and 211. Design feature 201 represents a design for a reticle feature to provide a corresponding pattern feature on wafer formed using a reticle designed with a design having design feature 201. Phase shift segment 207 has too small of a width (W) to be manufactured on a reticle. Accordingly, the design feature 221 is optimized such that the phase shift segment 207 is removed as shown on design feature 221, and chrome segments 205 and 209 are expanded to form chrome segment 225 of design feature 221.

Phase shift segment 207 may be a result of a design binning rule for generating zebra features (e.g. as used in 107) or for binning other mixed features. An example of some design binning rules which may produce segment 207 include chrome segments of a certain width (e.g. 205 and 209) in all corners with phase shift segments inserted there between. Such rules may result in a feature that may not be manufactureable in a reticle. Accordingly, a reticle design may be optimized by converting below minimum size segments.

Figure 3:
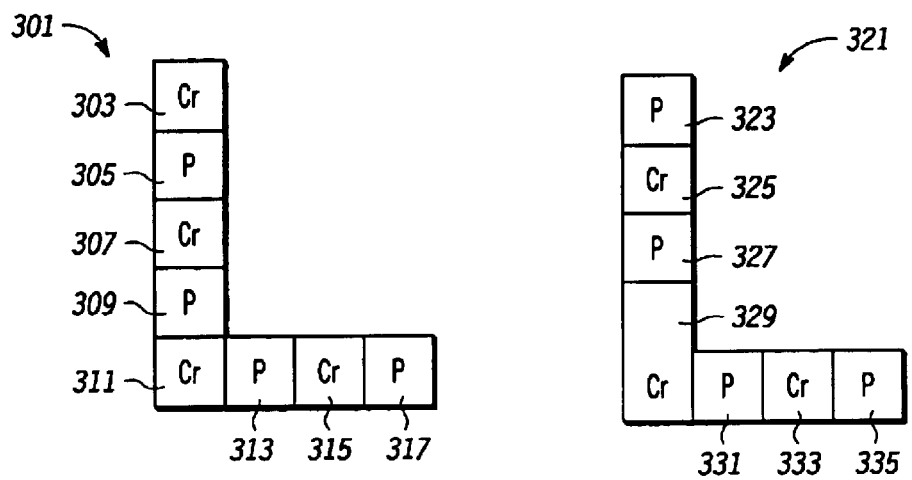
FIG. 3 is top view of another embodiment of a design feature and an optimized design feature according to the present invention.

FIG. 3 shows an example of a optimization of a zebra design feature according to the present invention. Design feature 301 includes chrome segment 303 located at the end of design feature 301. It is preferable for a zebra feature (or other type of mixed feature) to have a phase segment at the end of the feature, in some embodiments, for improved line end pull back and line length control. Accordingly, feature 321 represents an optimization in that a phase shift segment 323 is located at the end of feature 321. Chrome segment 329 represents a merging of comer segment 311 and converted phase shift segment 309 of design feature 301.

Figure 4:
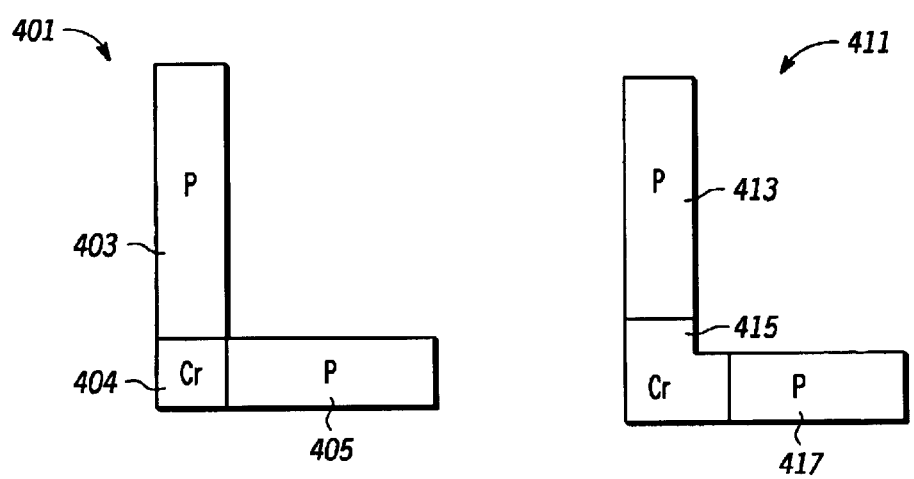
FIG. 4 is top view of another embodiment of a design feature and an optimized design feature according to the present invention.
Figure 5:
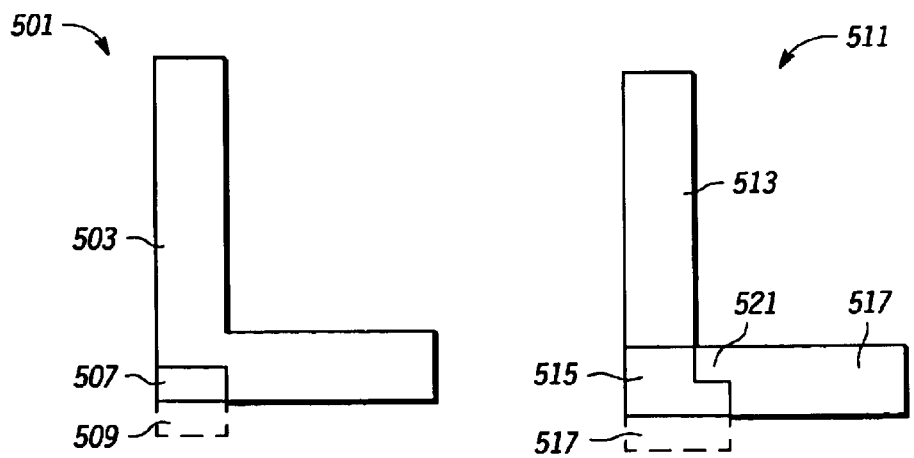
FIG. 5 is top view of reticle features according to the present invention.

FIG. 4 shows an example of another optimization of a mixed design feature according to the present invention. FIG. 4 shows a mixed design feature 401 and optimized mixed designed feature 411, wherein feature 411 is an optimized feature of feature 401. FIG. 5 shows a reticle feature 501 built on a reticle that is patterned from design feature 401. FIG. 5 also shows a second reticle feature 511 built on a reticle that is patterned from design feature 411.

Mixed design feature 401 includes a corner chrome segment 404 and two phase shift segments 403 and 405. One problem that may occur with the use of design feature 401 to produce a reticle feature is that chrome segment 404 may be misaligned during the manufacture of a reticle such that the resultant chrome feature 507 (of FIG. 5) of a reticle does not cover the desired corner location (e.g. the area as designated by designed segment 404).

Referring to FIG. 5, reticle feature 501 is patterned from design feature 401. During manufacture, reticle feature 501 is first patterned to be entirely of chrome. Then the chrome of feature 507 is patterned wherein the chrome of other areas of feature 501 (segment 503) is removed such that those portions will be phase shift segments. However, during this patterning, the pattern on a reticle maybe become misaligned, wherein a portion 509 of the reticle as designated by segment 404 (of FIG. 4) is located outside of feature 501. Accordingly, the resultant chrome segment 507 of reticle feature 501 is smaller than desired due to this misalignment.

Referring back to FIG. 4, design feature 401 may be optimized (as shown by design feature 411) such that chrome segment 404 is increased to segment 415 where a misalignment (within the overlay tolerances of the reticle manufacturing tool) of the patterning of chrome segment 415 will still provide a chrome corner segment of acceptable dimensions. For example, the edges of chrome segment 415 are expanded as compared to the edges of segment 404 by an amount corresponding to the manufacturing overlay tolerances. Accordingly, chrome feature 511, which is built from the design of design segment 415, will still sufficiently cover the desired corner area even if segment 515 is misaligned during manufacture.

Figure 6:
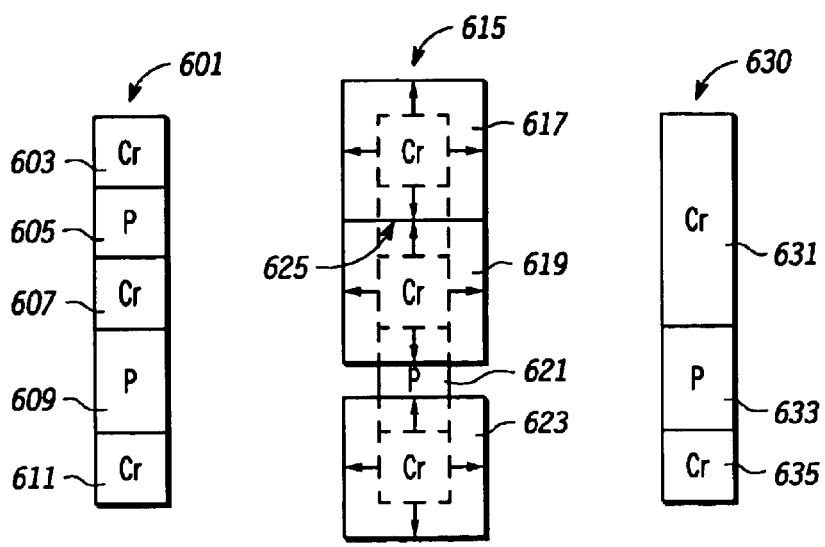
FIG. 6 is top view of another embodiment of a design feature, a transitory design feature, and an optimized design feature according to the present invention.

FIG. 6 shows a design feature 601 which is optimized by an over/under operation (as illustrated by intermediate design feature 615) to produced optimized design feature 630. In the over/under operation, the edges of the chrome design segments 603, 607, and 611 are expanded in all directions by a predetermined distance to produce expanded segments 617, 619, and 623, respectively, of intermediate design feature 615. Where two expanded segments contact (touch or overlap) (e.g. such as at line 625), those expanded segments merge into one segment. The edges of the resulting segments are then contracted by the same predetermined distance to produce design feature 630. Because expanded segments 619 and 617 merged into one segment, opposing edges of expanded segments 619 and 617 disappear, wherein those edges to do not contract. Thus, merged segment 631 includes the area of chrome segments 603 and 607 as well as phase shift segment 605.

Using the over/under approach allows a combination feature to be optimized by eliminating those segments that are too small to be manufactured on a reticle. In one example, the predetermined expansion distance is one half the minimum manufacturing width of a design segment. Thus, the expansion of two adjacent chrome segments (e.g. chrome segments 603 and 607) will merge where the segment located there between (phase shift segment 605) is less than the minimum manufacturing width. However, where the segment is greater than the manufacturing width (e.g. phase shift segment 609), that segment will remain (e.g. as segment 633) after the adjacent segments (e.g. 607 and 611) have contracted.

Figure 7:
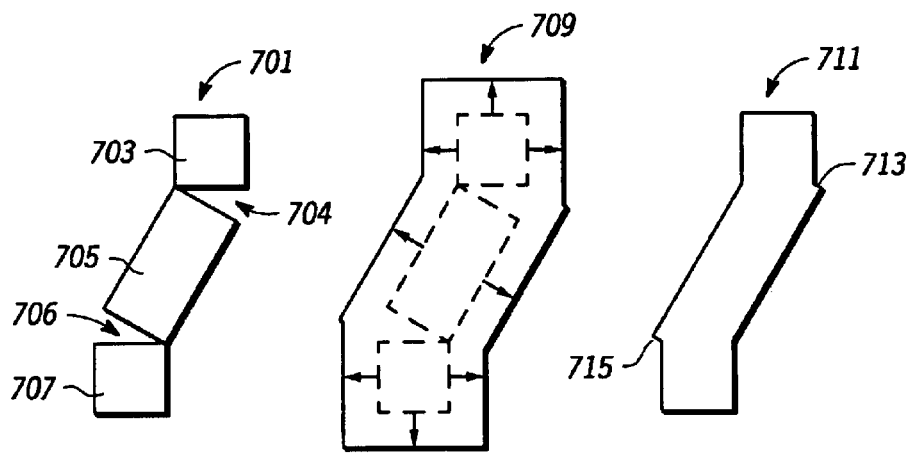
FIG. 7 is top view of another embodiment of a design feature, a transitory design feature, and an optimized design feature according to the present invention.

FIG. 7 shows another example of how a design feature 701 may be optimized by an over/under operation to produce optimized design feature 711. Features 703, 705, and 707 are either phase shift design features or chrome design features having discontinuities 704 and 706 there between due to the geometry of their layout. These discontinuities are attributed to the fact that feature 705 is oriented at a non 90 degree angle with respect to features 703 and 707. The edges of features 703, 705, and 707 are expanded by a predetermined distance as shown by intermediate design feature 709. Where two expanded features touch or overlap, those expanded features merge into one feature (e.g. see intermediate feature 709). The edges of the resulting feature are then contracted by the same predetermined distance (see segment 711). By using the over/under operation, discontinuities 704 and 706 in the design feature may be removed.

Using the over/under operation to remove discontinuities may result in undesirable extensions 713 and 715. However, in some embodiments, these extension are too small to produce a patterned feature on a wafer.

In other embodiments, an under/over operation may be performed on a feature for optimization. In an under/over operations, the edges of a segment are contracted by a predetermined distance. If the segment still exists after contraction, the edges are then expanded by the predetermined distance. If the segment disappears after contraction, the segment is removed from the design. In other embodiments, phase shift design segments may be contracted or expanded in under/over or over/under operations.

Figure 8:
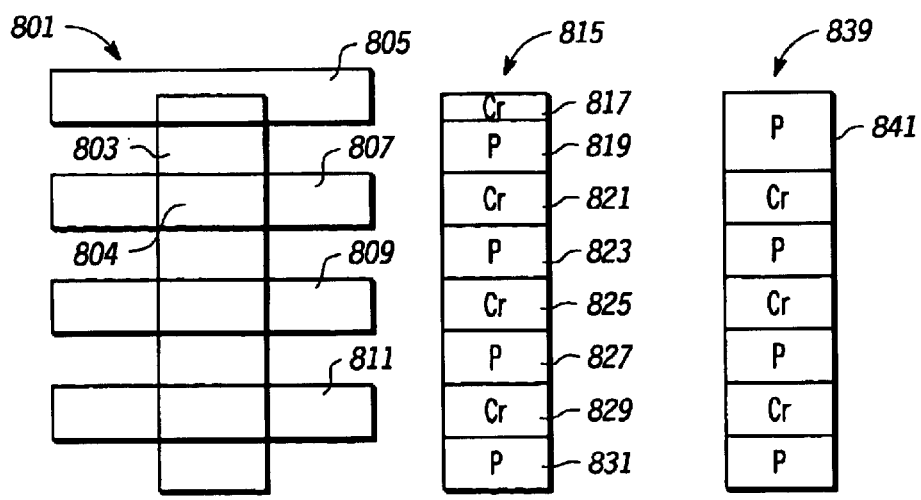
FIG. 8 is a top view showing stages of one embodiment of a design feature for the design of a zebra feature according to the present invention.

FIG. 8 illustrates an example of forming zebra design features that include both chrome and phase shift segments. These zebra features may be used to implement design features having widths that are in between a desired range to be implemented as chrome features and a desired range to be implemented as phase shift features.

In generating a reticle design, reticle layout is divided into striped portions (805, 807, 809, and 811). In the embodiment shown, the striped portions have a predetermined width and spacing in a direction perpendicular to the length of the stripes. In other embodiments, the predetermined width and spacing may be in a direction that is at a non-90° angle to the length of the stripes. The portions (e.g. 804) of design feature 801 located in these striped portions are then designated to be chrome segments with portions (e.g. 803) of feature 801 located outside of these striped portions designated to be phase shift segments.

With other embodiments, the phase shift segments may be designated by the stripes. Design feature 815 is a resultant zebra feature of feature 801 after the designation of the chrome and phase shift segments. In one embodiment, feature 815 is generated by a logic operation of the stripe portions and the design feature designated to be a zebra design feature.

Design feature 839 is an optimized zebra design feature of zebra design feature 815. Design feature 839 has been optimized such that the end portion of feature 815 is to be a phase shift segment due to better definition at the edge. Accordingly, phase segment 819 is expanded to include chrome segment 817 to form phase shift segment 841.

In other embodiments, other optimization operations maybe performed on feature 815 (e.g. over/under, under/over, or expanding a corner for manufacturing tolerances, converting an end segment) to optimize feature 815 for manufacturability.

In other embodiments, stripe portions (e.g. 805 and 807) are positioned over features binned in the zebra features bin. In other embodiments, stripe portions are positioned over the entire reticle layer, where the logic operation is performed with the stripes and any feature designated as a zebra feature.

Figure 9:
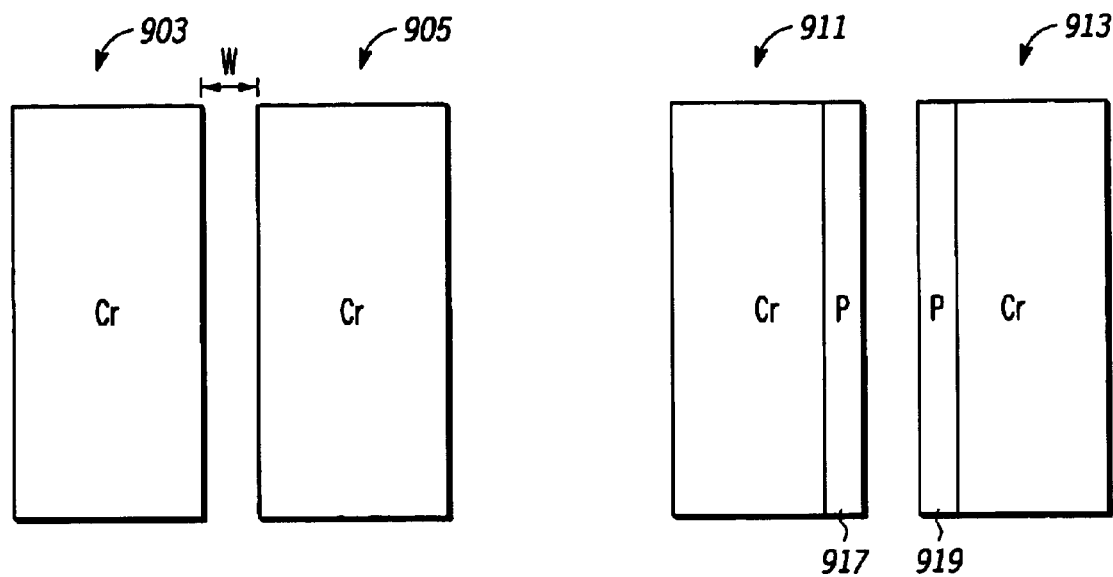
FIG. 9 is a top view of design features and optimize design features according to the present invention.

FIG. 9 shows another optimization operation of a design feature. In FIG. 9, design feature includes two relatively large chrome design features 903 and 905 separated by a relatively small width (designated in FIG. 9 by "W"). Typically, these small widths may produce problems when features 903 and 905 are patterned on a wafer. Accordingly, during optimization, the side portions of chrome features 903 and 905 adjacent to the small width are converted to phase shift segments (917 and 919) for design features of 911 and 913 to improve the process margins on small spaces on the wafer.

It may be desirable during the design of a reticle layout to adjust the dimensions of a feature. One such example may be where a design was determined to be inoperative (e.g. after design verification (115) or wafer manufacturing). A second example may be during design optimization (113) to utilize optical proximity correction to alter the reticle feature dimensions so that the wafer feature dimensions are correct.

One problem with changing dimensions of a desired feature on a wafer is that a change in the reticle dimension is not necessarily linear with a change in a wafer feature.

Figure 10:
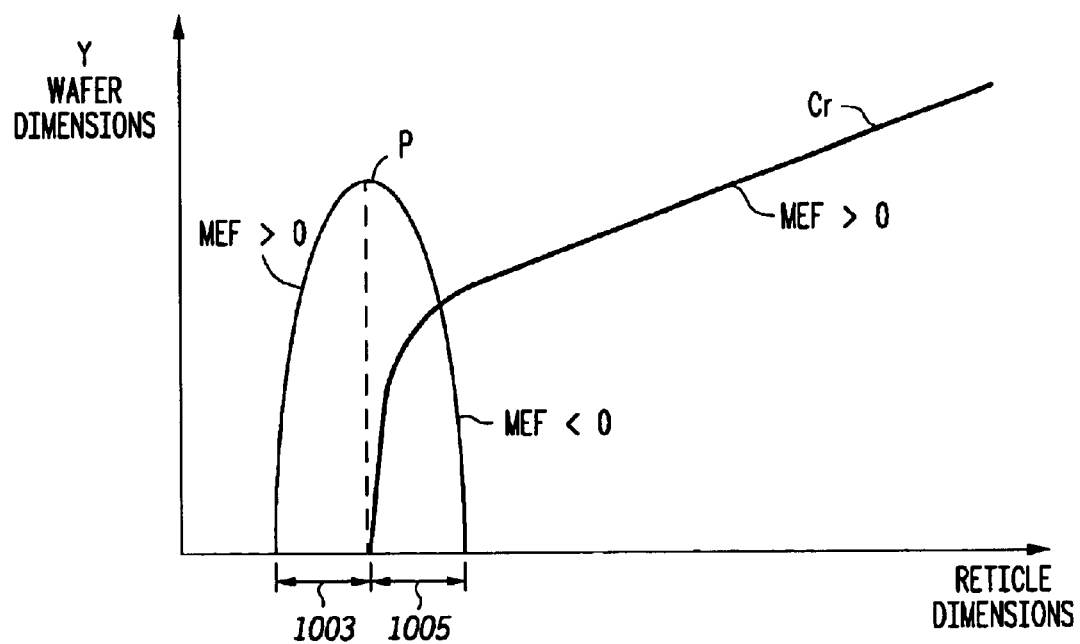
FIG. 10 is a graph of reticle feature dimensions versus resultant wafer feature dimensions for binary features and phase shift features according to the present invention.

FIG. 10 illustrates an example of mask error factors (MEF) for chrome features and phase shift features over a range of reticle widths and their effects on feature dimensions of the wafer. The MEF for phase shift features is the slope of the line as designated by "P" and the MEF for chrome features is the slope of the line designated by "Cr." As shown in FIG. 10, the MEF for chrome features is positive and constant beyond a certain reticle dimension.

In the embodiment shown, the MEF for phase shift features is positive (MEF>0) and increasing for a range (1003) of reticle dimensions. The MEF for phase shift features is negative (MEF<0) and decreasing for a second range (1005) of reticle dimensions.

For phase shift features having width located where the MEF is negative (range 1005), an increase in the width of the phase shift reticle feature provides for a decrease in width of a wafer feature patterned from the phase shift feature. Thus, changing the dimension of a reticle feature will not necessarily provide for a corresponding change in the dimension of a wafer feature.

Figure 11:
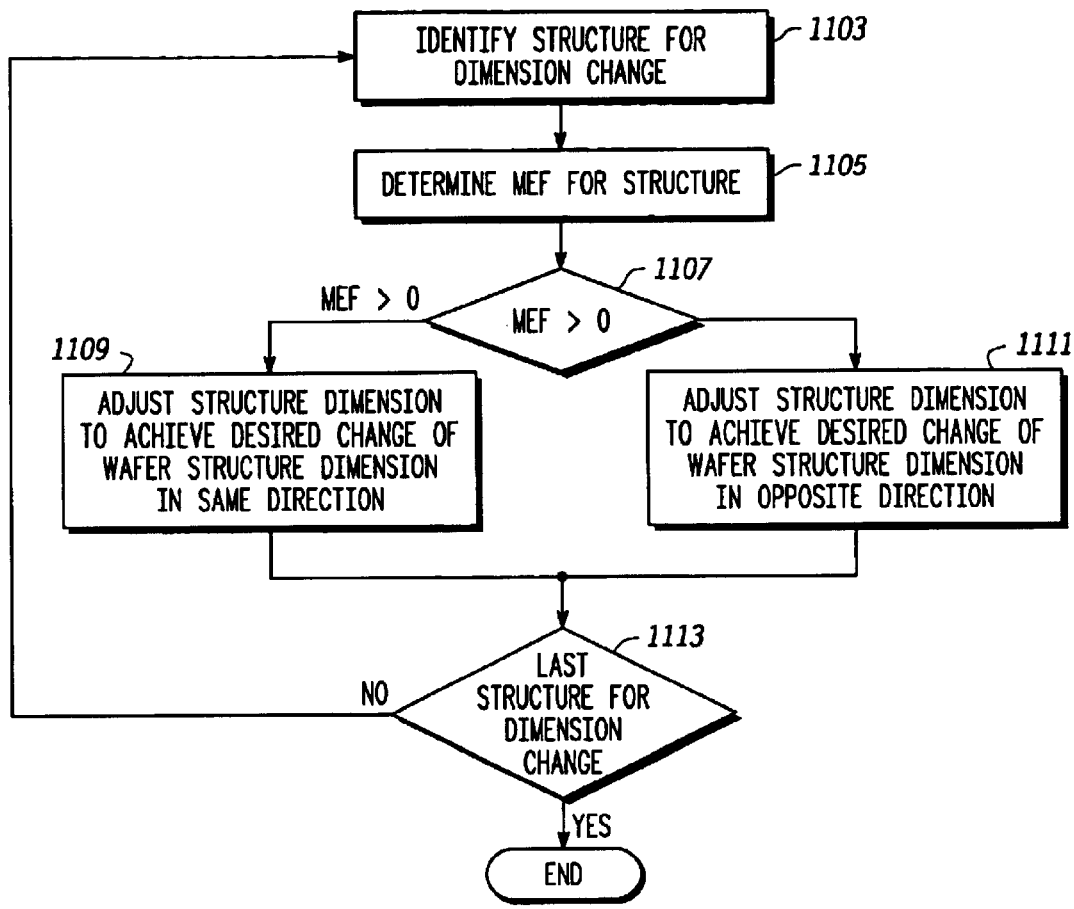
FIG. 11 is a flow chart of one embodiment for changing the dimension of a design feature of a reticle according to the present invention.

FIG. 11 is a flow diagram of one embodiment of a process for changing the dimension of a reticle feature. This flow may be implemented as part of generating a reticle layout (e.g. 107) or of optimization operations (e.g. 109).

In 1103, a reticle feature is identified for dimension change (e.g. either increasing or decreasing). In 1105, a MEF is determined for the feature. The MEF of the feature is a function of the type of feature (e.g. phase shift or chrome), the width of the feature, and the space to neighboring features. If in 1107, it is determined that MEF>0, then in 1109, the reticle feature dimension is adjusted in the same direction as the desired change in the wafer feature. If in 1107, its determined that MEF<0, then in 1111, the reticle feature dimension is adjusted in the opposite direction as the desired change in the wafer feature. Also, in 1107 if it is determined that MEF<0, then, in some embodiments of 1111, the phase shift segment can be converted into a binary segment. With some of these embodiments, if it is determined that MEF<0, then the feature dimension may be adjusted in the opposite direction or converted to a binary feature, depending upon the desired change in the dimension. This process is performed until all of the features identified for dimension changed have been processed (e.g. as determined in 1113).

In other embodiments, where the MEF<0, no change to the reticle dimension may be made (e.g. as in 1111). In other embodiments, an MEF determination may be made for each segment of a feature.

Implementing a process for designing a reticle that includes an evaluation of the MEF for a feature may provide for a process that allows for dimension features to be more accurately adjusted to achieve the desired wafer dimensions.

Figure 12:
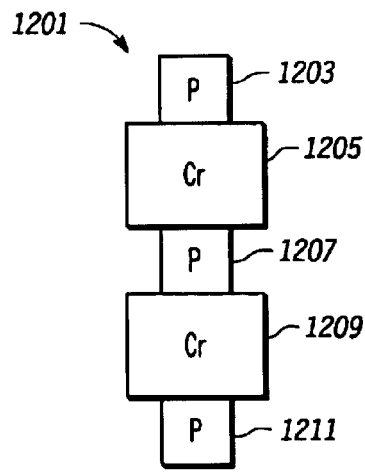
FIG. 12 is a top view of one embodiment of a zebra feature for achieving a linear edge on a wafer according to the present invention, check this description.

FIG. 12 shows a zebra design feature that has been optimized to produce a desirable straight wafer feature edge. In the embodiment of FIG. 12, chrome segments 1205, and 1209 may be expanded (or the phase shift segments 1203, 1207 and 1211 may be decreased) due to the differences in MEFs of chrome and phase shifting features. Such a feature may be the result of a change in feature dimensions (e.g. as with the flow of FIG. 11).

In other embodiments, other types of binary reticle features (e.g. other opaque materials such as silicon) may be utilized in place of chrome features as described above.

In one aspect, a method for generating a reticle design includes generating a reticle pattern layout and generating a reticle design from the pattern layout. The reticle design includes at least one mixed feature including both a phase shift segment and a binary segment. The method further includes optimizing design features of the reticle design to generate an optimized reticle design. The optimizing includes at least one of converting at least a portion of a phase shift design segment of a mixed design feature of the reticle design to a binary portion or converting at least a portion of a binary design segment of a mixed design feature of the reticle design to a phase shift portion.

In another aspect of the invention, a method for generating a reticle design includes generating a reticle design. The reticle design includes mixed features that include a binary segment and a phase shift segment. The method also includes optimizing the reticle design to generate an optimized reticle design. The optimizing includes at least one of performing an over/under operation, an under/over operation, a feature segment expansion operation, a feature edge portion conversion from a binary portion to a phase shift portion, a corner binary segment expansion, a discontinuity removal operation, a below minimum width segment conversion operation, or a feature dimension change operation that include a determination of a Mask Error Factor (MEF).

While particular embodiments of the present invention have been shown and described, it will be recognized to those skilled in the art that, based upon the teachings herein, further changes and modifications may be made without departing from this invention and its broader aspects, and thus, the appended claims are to encompass within their scope all such changes and modifications as are within the true spirit and scope of this invention.

What is claimed is:

1. A method for generating a reticle design, comprising:
   generating a reticle pattern layout;
   generating a reticle design from the pattern layout, wherein the reticle design includes at least one mixed feature including both a phase shift segment and a binary segment;
   optimizing design features of the reticle design to generate an optimized reticle design, wherein the optimizing includes at least one of converting at least a portion of a phase shift design segment of a mixed design feature of the reticle design to a binary portion or converting at least a portion of a binary design segment of a mixed design feature of the reticle design to a phase shift portion.

2. The method of claim 1 further comprising:
   building a reticle from the optimized reticle design.

3. The method of claim 1 wherein the converting includes using at least one of an over/under operation or an under/over operation.

4. The method of claim 3, wherein:

the converting includes using an over/under operation;

the over/under operation includes a first operation of expanding edges of phase shift segments of a design feature by a fixed amount, wherein for an expanded edge that contacts another expanded edge, the contacting expanded edges disappear; and the over/under operation includes a second operation of retracting remaining expanded edges of the phase shift segments of the feature by the fixed amount.

5. The method of claim 4, wherein a binary segment located between two phase shift segments whose opposing sides disappear during the first operation is eliminated from the feature.

6. The method of claim 3, wherein:

the converting includes using an over/under operation;

the over/under operation includes a first operation of expanding edges of binary segments of a design feature by a fixed amount, wherein for an expanded edge that contacts another expanded edge, the contacting expanded edges disappear; and the over/under operation includes a second operation of retracting remaining expanded edges of binary segments of the feature by the fixed amount.

7. The method of claim 6, wherein a phase shift segment located between two binary segments whose opposing sides disappear during the first operation is eliminated from the feature.

8. The method of claim 1 wherein the converting further includes converting a design feature edge portion from a binary design portion to a phase shift design portion.

9. The method of claim 8 wherein the design feature edge portion is located at an end of a feature.

10. The method of claim 1 wherein the converting further includes enlarging a corner binary segment.

11. The method of claim 10 wherein the corner binary segment is enlarged based upon an overlay tolerance of a reticle manufactoring tool.

12. The method of claim 1 wherein the generating a reticle design includes generating zebra design features.

13. The method of claim 12 wherein the converting includes converting one of a phase shift portion or binary portion of a zebra feature to the other of a phase shift portion or a binary portion.

14. The method of claim 12 wherein the generating zebra design features further include:

imposing spaced apart striped regions with designated mixed design features wherein portions of the designated mixed design features located in the striped regions are designated as one of phase shift segments or binary segments, and the portions of the designated mixed design features located outside of the striped regions are designated as the other of the phase shift segments or binary segments.

15. The method of claim 1 further comprising:

determining a mask error factor (MEF) of a design structure;

if the MEF of the design structure is positive, adjusting the size of the design structure to achieve an adjustment in size in a same direction of a wafer structure patterned as per the design structure;

if the MEF of the design structure is negative, performing one of adjusting the size of the design structure to achieve an adjustment in size in an opposite direction of the wafer structure or converting the design structure from a phase shift structure to a binary structure.

16. The method of claim 1 wherein the reticle design includes a feature with a portion oriented at non 90 degree angles with respect to other portions of the feature.

17. The method of claim 16 wherein the optimizing further includes performing one an over/under or under/over to remove a discontinuity in the feature with the portion oriented at a non 90 degree angle.

18. The method of claim 1 wherein the optimizing includes a below minimum width segment conversion operation.

19. The method of claim 1, further comprising binning features of a pattern layout as a function of a feature width in bins, wherein the bins include a phase shift feature bin, a binary feature bin, and a zebra feature bin.

20. The method of claim 19 wherein the generating a reticle design includes sizing features prior to the binning in order to reduce a number of features binned into zebra feature bins.

21. A method for generating a reticle design comprising:

generating a reticle design, the reticle design including mixed features that include a binary segment and a phase shift segment;

optimizing the reticle design to generate an optimized reticle design, wherein the optimizing includes at least one of performing an over/under operation, an. under/over operation, a feature segment expansion operation, a feature edge portion conversion from a binary portion to a phase shift portion, a corner binary segment expansion, a discontinuity removal operation, a below minimum width segment conversion operation, or a feature dimension change operation that include a determination of a Mask Error Factor (MEF).

22. The method of claim 21 further comprising:

building a reticle from the optimized reticle design; and exposing the reticle in a lithographic system to form photo-resist features on a wafer.

* * * * *